United States Patent
Otsuka et al.

(10) Patent No.: US 6,914,502 B2
(45) Date of Patent: Jul. 5, 2005

(54) WIRING STRUCTURE FOR TRANSMISSION LINE HAVING GROOVED CONDUCTORS

(75) Inventors: Kanji Otsuka, 2-1074-38, Kohan, Higashiyamato-shi, Tokyo 207-0002 (JP); Tamotsu Usami, 2-38-4, Nishimachi, Kokubunji-shi, Tokyo 185-0035 (JP)

(73) Assignees: Kanji Otsuka, Tokyo (JP); Tamotsu Usami, Tokyo (JP); Oki Electric Industry Co., Ltd., Tokyo (JP); Sanyo Electric Co., Ltd., Osaka (JP); Sharp Kabushiki Kaisha, Osaka (JP); Sony Corporation, Tokyo (JP); Kabushiki Kaisha Toshiba, Tokyo (JP); NEC Corporation, Tokyo (JP); Hitachi, Ltd., Tokyo (JP); Fujitsu Limited, Kanagawa (JP); Matsushita Electric industrial Co., Ltd., Osaka (JP); Mitsubishi Denki Kabushiki Kaisha, Tokyo (JP); Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/988,017

(22) Filed: Nov. 16, 2001

(65) Prior Publication Data

US 2002/0070825 A1 Jun. 13, 2002

(30) Foreign Application Priority Data

Nov. 17, 2000 (JP) .......................................... 2000-350904

(51) Int. Cl.[7] .................................................. H01P 3/08
(52) U.S. Cl. ............................................. 333/238; 333/1
(58) Field of Search ................................. 333/238, 246, 333/243, 1

(56) References Cited

U.S. PATENT DOCUMENTS 5,519,363 A  *  5/1996  Boudreau et al. ............... 333/1

FOREIGN PATENT DOCUMENTS

| DE | 2645056 | * 4/1978 | ................. 333/238 |
|----|---------|----------|--------------------------|
| JP | 63-5712 | 1/1988 | |
| JP | 3-280701 | 12/1991 | |
| JP | 6-283910 | 10/1994 | |
| JP | 7-135407 | 5/1995 | |
| JP | 9-36111 | 2/1997 | |
| JP | 9-232820 | 9/1997 | |
| JP | 10-326783 | 12/1998 | |
| JP | 11-191708 | 7/1999 | |
| JP | 11-282592 | 10/1999 | |

* cited by examiner

Primary Examiner—Benny Lee
(74) Attorney, Agent, or Firm—McDermott Will & Emery LLP

(57) ABSTRACT

A wiring structure for a transmission line has a ground line (2) and a signal line (1). The signal line (1) is disposed so as to face the ground line (2) through a dielectric (3). A surface of the signal line (1) facing the ground line (2) has a groove extending in the transmission direction. A surface of the ground line (2) facing the signal line (1) also has a groove extending in the transmission direction. The grooves restrain that electromagnetic induction is caused in the signal line (1) due to an electromagnetic field generated by other adjacent signal lines (1).

2 Claims, 7 Drawing Sheets

STACKED PAIR LINE

MICRO STRIP LINE

WIRING STRUCTURE FOR TRANSMISSION LINE HAVING GROOVED CONDUCTORS

This application is based on the patent application No. 2000-350904 filed in Japan, the contents of which are hereby incorporated by reference.

BACKGROUND OF THE INVENTION

1. Field of the Invention

The present invention relates to a wiring structure for a transmission line.

2. Description of the Related Art

A conventional wiring structure for a transmission line is disclosed, for example, in the Japanese Laid-open Patent Publication No 10-326783.

FIG. 12 is a perspective view showing the conventional wiring structure. As shown in FIG. 12, the wiring structure for the transmission line is provided with a ground conductor 101, and a signal line 103 disposed so as to face the ground conductor 101 through a dielectric layer 102. As to a surface 104 of the signal line 103 facing the ground conductor 102, the irregularity (unevenness) in the direction parallel to the transmission direction is smaller than the irregularity in the direction perpendicular to the transmission direction. The irregularity increases the surface area of the signal line 103 to effectively reduce its conductor loss due to the skin effect. Another wiring structure relating to the above-mentioned wiring structure is disclosed in the Japanese Laid-open Patent Publication No. 9-36111.

In the conventional wiring structure for the transmission line, the conductor loss due to the skin effect can be effectively reduced by providing the irregularity on the surface 104 of the signal line 103 facing the ground conductor 101. However, the electromagnetic field generated between the signal line 103 and the ground conductor 101 may easily spread out due to the function of the convex portions in the irregularity at the end portion of the surface 104 of the signal line 103 facing to the ground conductor 101. The electromagnetic field causes electromagnetic induction in other signal lines adjacent to the signal line 103. Thus, there may occur such a problem that the wave shapes of the signals in the adjacent signal lines, in which the electromagnetic induction has been caused, are distorted.

SUMMARY OF THE INVENTION

The present invention has been developed to solve the above-mentioned problem and has an object to provide a wiring structure for a transmission line, which can minimize the electromagnetic induction caused in signal lines due to electromagnetic fields generated by other adjacent signal lines.

According to the first aspect of the present invention, which has been developed to achieve the above-mentioned object, there is provided a wiring structure for a transmission line including a ground line and a signal line disposed so as to face the ground line through a dielectric. At least one of a surface of the signal line facing the ground line and a surface of the ground line facing the signal line is provided with a groove extending in a transmission direction.

According to this wiring structure, extent of an electromagnetic field generated by the signal line may become smaller. As a result, electromagnetic induction caused in other signal lines adjacent to the signal line due to the electromagnetic field is minimized.

In the wiring structure according to the first aspect, the groove may be located at a nearly center position of the facing surface. Alternatively, the facing surface may be provided with a plurality of the grooves. If so, the extent of the electromagnetic field generated by the signal line may become much smaller. As a result, the electromagnetic induction caused in the adjacent signal lines can be more effectively restrained.

According to the second aspect of the present invention, there is provided a wiring structure for a transmission line including a wiring substrate, a dielectric provided on a main surface of the wiring substrate, a ground line disposed in the dielectric, and a signal line disposed so as to face the ground line. The ground line is also disposed in the dielectric. At least one of a surface of the signal line facing the ground line and a surface of the ground line facing the signal line is provided with a groove extending in a transmission direction. The surface of the signal line and the surface of the ground line are perpendicular to the main surface of the wiring substrate.

According to this wiring structure, extent of an electromagnetic field generated by the signal line may become smaller. As a result, electromagnetic induction caused in other signal lines adjacent to the signal line due to the electromagnetic field is minimized.

The wiring structure according to the second aspect may include a plurality of wiring assemblies each of which is composed of the ground line, the signal line and the dielectric. Hereupon, the transmission directions of the signal lines are different from one another at every wiring assembly. In this case, the wiring structure can transmit signals in various directions.

In the wiring structure according to the second aspect, a flat ground (a ground of a plate shape) may be provided between the wiring assemblies. In this case, the electromagnetic induction caused in the adjacent signal lines is minimized.

In the wiring structure according to the second aspect, each of the grooves may be located at a nearly center position of the surface corresponding thereto. Alternatively, each of the surfaces may be provided with a plurality of the grooves. If so, the extent of the electromagnetic field generated by the signal line may become much smaller. As a result, the electromagnetic induction caused in the adjacent signal lines is minimized.

The wiring structure according to the second aspect may further includes a power supply line disposed in the dielectric, in which a surface of the signal line facing the power supply line and a surface of the ground line facing the power supply line are perpendicular to the main surface of the wiring substrate. Hereupon, the ground line and the power supply line may be disposed so as to face to each other through the signal line in the direction parallel to the main surface of the wiring substrate. Alternatively, the ground line and the power supply line may be disposed so as to directly face to each other in the direction parallel to the main surface of the wiring substrate. If so, the extent of the electromagnetic field generated by the signal line may become much smaller. In consequence, it may be more effectively restrained that the electromagnetic induction is caused in the adjacent signal lines.

BRIEF DESCRIPTION OF THE DRAWINGS

Various characteristics and advantages of the present invention will become clear from the following description taken in conjunction with the preferred embodiments with reference to the accompanying drawings throughout which like parts are designated by like reference numerals, in which.

DETAILED DESCRIPTION OF THE PREFERRED EMBODIMENTS

Hereinafter, embodiments of the present invention will be described with reference to the accompanying drawings.
(Embodiment 1)

Hereinafter, there will be described a wiring structure far a transmitting line according to Embodiment 1 of the present invention with reference to the accompanying drawings.

Figure 1:
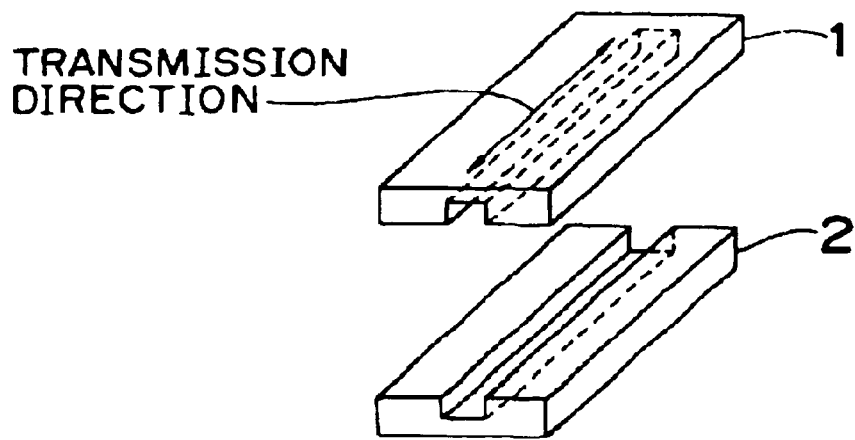
FIG. 1 is a perspective view of a transmission line disposed in a dielectric, which shows the line in a see-through manner.

FIG. 1 is a perspective view of a transmission line disposed in a dielectric, which shows the line in a see-through manner. As shown in FIG. 1, each of a signal line 1 and a ground line 2 has a groove extending in the transmission direction on its surface facing the other line (referred to "Lacing surface" hereinafter). Although it is not shown in FIG. 1, the dielectric exists between the signal line 1 and the ground line 2. The dielectric may exist around the both lines 1 and 2. In FIG. 1, the signal line 1 and the ground line 2 have widths identical to each other and forming a stacked pair line. However, the both lines 1 and 2 may form a micro strip line or a strip line so long as it has grooves extending in the transmission direction on their facing surfaces.

FIGS. 2A, 2B, 2C and 2D are sectional views of transmission lines, each of which shows the structure of the grooves formed on the facing surfaces of the signal line 1 and the ground line 2. Each of the transmission lines is composed of the signal line 1, the ground line 2, and the dielectric 3 interposed between the signal line 1 and the around line 2. Similar to that shown in FIG. 1, each of the signal line 1 and the ground line 2 has a groove extending in the transmission direction on its surface facing the other line.

Figure 2A:
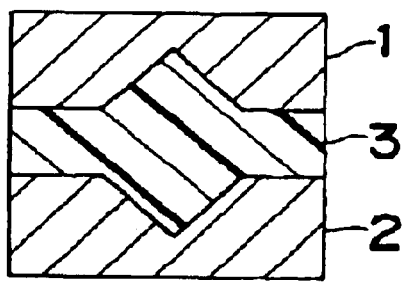
FIGS. 2A, 2B, 2C and 2D are sectional views of other transmission lines according to the present invention.
Figure 2B:
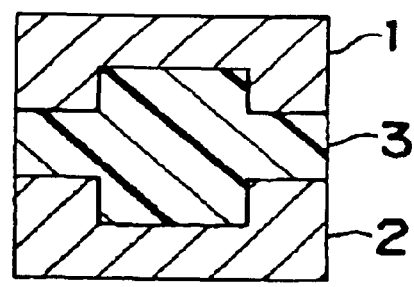
Figure 2C:
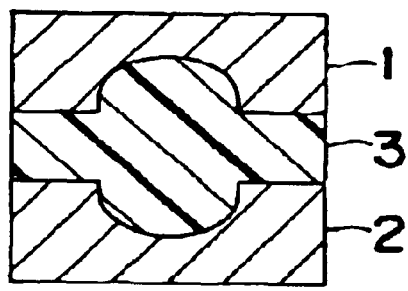
Figure 2D:
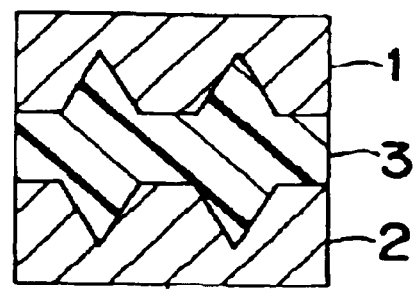

The grooves may be formed in various shapes such as a triangle (FIG. 2A), a rectangle (FIG. 2B) or a semicircle (FIG. 2C). The grooves may be formed in arbitrary shapes so long as the electromagnetic fields of the lines having the grooves do not affect other signal lines adjacent thereto. Further, as shown in FIG. 2D, the facing surface of each of the signal line 1 and the ground line 2 may be provided with a plurality of grooves. It is preferable that the groove is disposed at a nearly central position of the facing surface corresponding thereto. The shape of the groove can be changed in accordance with the process for making the groove. As the process for making the groove, a conventional damascene process, dual-damascene copper plating process or the like may be used. In addition, as a flattening process after the groove has been formed, a chemical buffing process or the like may be used. Hereupon, only one of the signal line 1 and the ground line 2 may be provided with the groove.

Figure 3A:
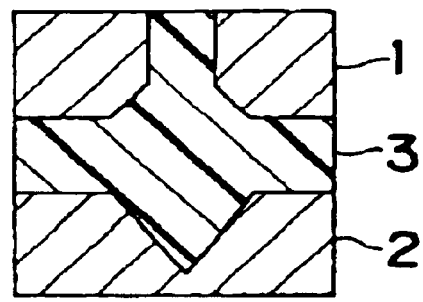
FIGS. 3A, 3B and 3C are sectional views of other transmission lines according to the present invention.
Figure 3B:
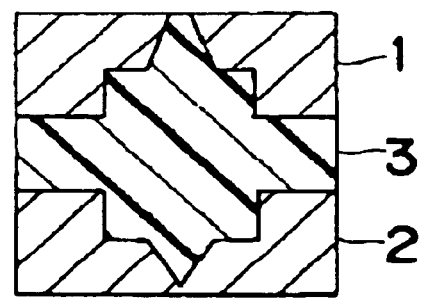
Figure 3C:
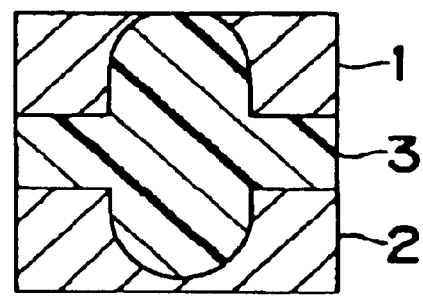

FIGS. 3A, 3B and 3C are sectional views of other transmission lines, each of which shows the structures of a groove and a cutout formed on the facing surfaces of the signal line 1 and the ground line 2, respectively. The cutout can be formed by forming the groove to excess from the facing surface toward the opposite surface till the groove penetrates the line. Alternatively, the cutout may be formed from the opposite surface toward the facing surface till it penetrates the line. FIG. 3A shows an example of the cutout, which is formed from the surface opposite to the surface having the groove, namely the surface of the signal line 1 not-facing the ground line 2. Each of FIGS. 3B and 3C shows an example of the cutout, which is formed from the surface having the groove, namely the surface of the signal line 1 facing the ground line 2. In each of FIGS. 3A to 3C, the cutout is formed only in the signal line 1. However, the cutout may be formed in the ground line 2, and not in the signal line 1. Alternatively, each of the signal line 1 and the ground line 2 may he provided with the respective cutout.

When the current changes, the lines of magnetic force 6 are generated or eliminated. Due to the change of the lines of magnetic force 6 such that the lines of magnetic forces are generated or eliminated, namely due to the change of the magnetic field, there is generated a induction current in a direction which prevents the magnetic field from being changed. Due to the induction current, the current tends to flow through a region that is less affected by the magnetic field. In general, the faster the change of the current becomes, that is the larger the vibration frequency becomes, the larger the induction current becomes.

Next, there will be described a reason why the groove or the cutout is provided on the facing surface of the signal line 1 or the ground line 2 of the transmission line.

Figure 4A:
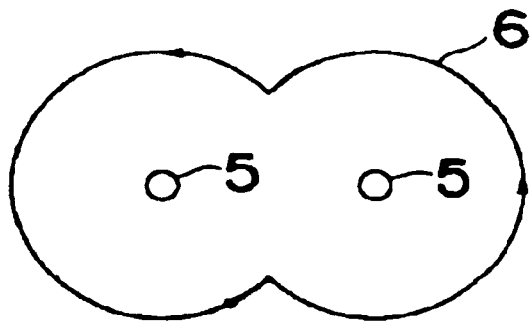
FIGS. 4A, 4B and 4C are views explaining the skin effect.
Figure 4B:
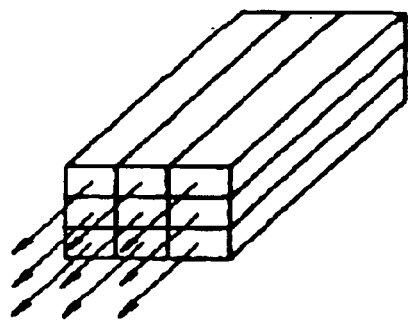
Figure 4C:
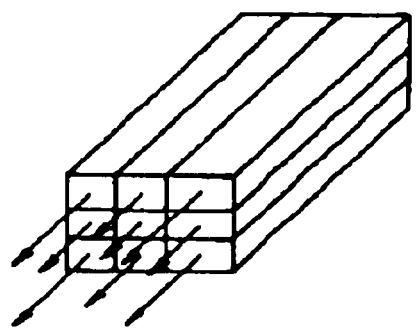

FIGS. 4A, 4B and 4C are views explaining the skin effect. FIG. 4A shows two electric wires 5 (current lines) and lines of magnetic force 6 generated by the electric wires 5. The electric wires 5, in which currents flow in the same direction, generate the lines of magnetic force 6 orienting in the same direction. When the electric wires 5 are adjacent to each other, they affect to each other. When the currents in the electric wires 5 flow upward in the directions perpendicular to the sheet plane of FIG. 4A in the steady state, the lines of magnetic force 6 orienting counterclockwise are generated in the sheet plane by the currents. As shown in FIG. 4A, the lines of magnetic force 6 generated by the two electric wires 5 orient in the opposite directions to each other in the region between the two electric wires 5. Therefore, the lines of magnetic force 6 generated by the two electric wires 5 negate to each other in the region between the two electric wires 5 so that the lines of magnetic force 6 has an oblong shape surrounding the two electric wires 5.

When the current changes, the lines of magnetic force 6 are generated or extinguished. Due to the change of the lines of magnetic force 6 such that the lines of magnetic forces are generated or eliminated, namely due to the change of the magnetic field, there is generated a induction current in a direction which prevents the magnetic field from being changed. Due to the induction current, the current tends to flow through a region that is less affected by the magnetic field. In general, the faster the change of the current becomes, the larger the vibration frequency becomes, the larger the induction current becomes.

Each of FIGS. 4B and 4C shows the state of the current flowing in each of portions in one signal line, the signal line being divided into nine portions. When the current changes, the uniform current distribution shown in FIG. 4B may be detorted. The reason for this is that it difficult for the current to flow through the central portion of the signal line which is easily affected by the magnetic field due to other currents because the induction current is generated as described above. Therefore, as shown in FIG. 4C, the current flowing through the corner portions and peripheral portions in the signal line may become more, because the portions are less affected by the magnetic field due to the current flowing through the adjacent lines. Such a phenomenon that the current density in the peripheral portions of the conductor becomes larger is referred to the skin effect. In particular, the skin effect remarkably occurs for the high-frequency. The skin effect is expressed by the following expression 1.

$$\delta_s = (2/(\omega \cdot \mu_r \cdot \sigma))^{1/2}$$  Expression 1

In the expression 1, $\delta_s$, $\omega$, $\mu_r$, and $\sigma$ denote the skin depth, the angular frequency of the alternating current, the magnetic permeability of the conductor and the electrical conductivity of the conductor, respectively. As apparent from the expression 1, the skin depth $\delta_s$, is in inverse proportion to the square root of $(\omega \cdot \mu_r \cdot \sigma)$.

Hereinafter, the skin effect in the transmission line, in which the lines are disposed so as to face to each other, will be described with reference to FIGS. 5A, 5B, 6A, 6B and 7.

Figure 5A:
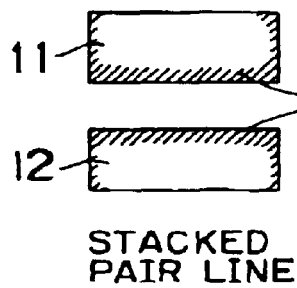
FIG. 5A is a view showing a current distribution in a stacked pair line.
Figure 5B:
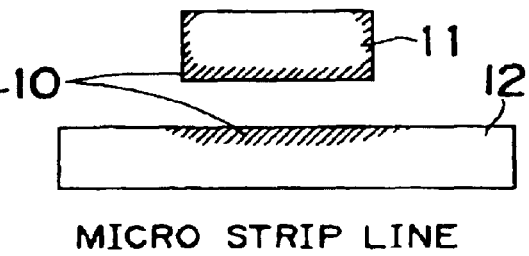
FIG. 5B is a view showing a current distribution in a micro strip line.

Each of FIGS. 5A and 5B shows the current distribution in the transmission line pair. FIG. 5A shows the current distribution in the stacked pair line. FIG. 5B shows the current distribution in the micro strip line. In each of them, a signal line 11 faces a ground line 12. In the transmission line pair, a non-uniform current distribution is caused clue to the skin effect. The regions with oblique lines 10 denote portions having higher current densities in comparison with the other portions. In each of FIGS. 5A and 5B, it is illustrated such that nothing exists between the signal line 11 and the ground line 12. However, in fact, a dielectric exits exists between the signal line 11 and the ground line 12. For example, dielectrics such as glass, epoxy resin, Teflon or ceramic may be used.

Figure 6A:
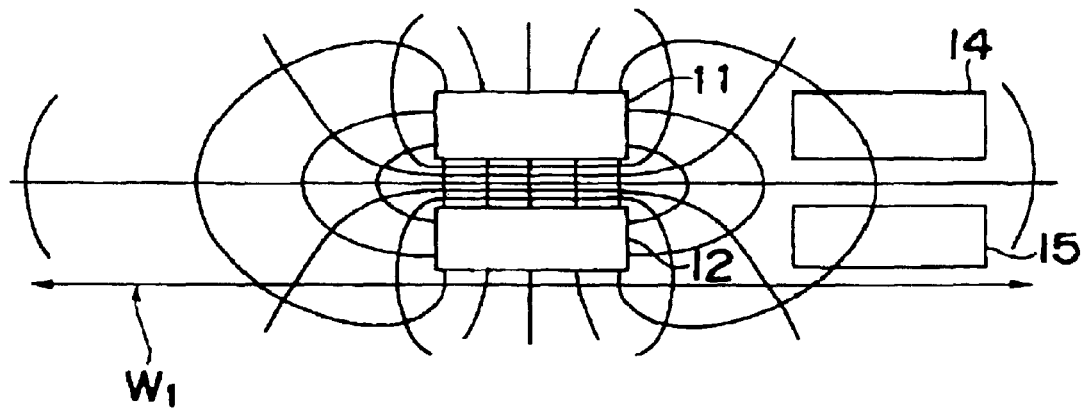
FIG. 6A is a view showing lines of electric force and lines of magnetic force in the stacked pair line when the current uniformly flows in the conductors.
Figure 6B:
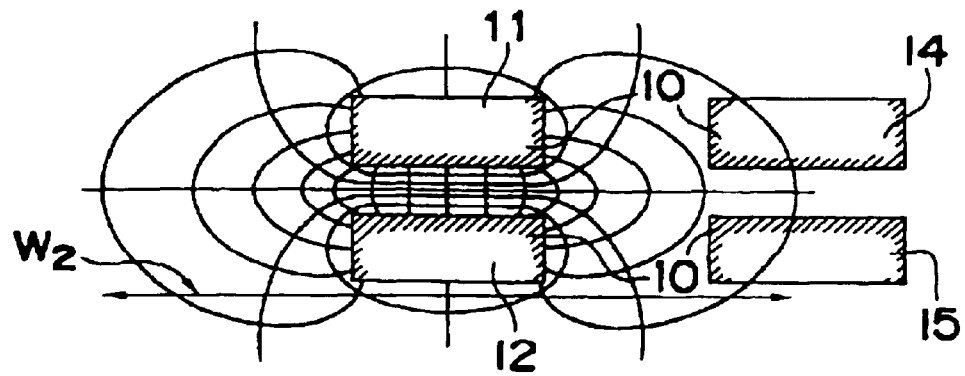
FIG. 6B is a view showing lines of electric force and lines of magnetic force in the stacked pair line when the current in-uniformly flows in the conductors due to the skin effect.

Each of FIGS. 6A and 6B shows the lines of electric force and the lines of magnetic force of the stacked pair line. FIG. 6A shows the lines of electric force and the lines of magnetic force when the current uniformly flows through the conductors. FIG. 6B shows the lines of electric force and the lines of magnetic force when the current un-uniformly flows through the conductors due to the skin effect.

According to Gauss's law, the lines of electric force always meet at right angles with the lines of magnetic force. The lines of electric force start from the positive electric charges in the conductors, and end at the negative electric charges. When the lines of electric force cross to the surface of the conductors, lines of electric force are normal to the surface if uniform electric potentials prevail in the conductors. However, the lines of electric force incline to the region in which electric charge distribution is higher. The lines of magnetic force in the clockwise directions, which are perpendicular to the direction along which the current flows through the electric wire, are generated so as to surround the electric wire. The lines of electric force and the lines of magnetic force are distributed in the space so as to hold intervals with the adjacent lines of electric force and the adjacent lines of magnetic force respectively, in accordance with the minimum energy law. In accordance with the electric charge density or the current, the density of the lines of electric force and the density of the lines of magnetic force are increased or decreased.

In the case of FIG. 6A, the electric charge distribution in the conductor is uniform, because the currents uniformly flow through the conductors. Therefore, the intervals among the lines of electric force are uniform, for example in the region between the signal line 11 and the ground line 12. However, in the case of FIG. 6B, the electric charges are concentrated in the region having the oblique lines 10, because the currents are concentrated in the regions having the oblique lines 10 due to the skin effect. Therefore, the density of the lines of electric force is also raised in the region near the regions having the oblique lines 10, in which the currents are concentrated, in comparison with the case of FIG. 6A. In the region in which the density of the lines of electric force is raised, namely in the region with the stronger electric field, the density of the lines of magnetic force is raised so that the magnetic field becomes stronger.

The electromagnetic field originally spreads out to the infinite region. However, the effective electromagnetic field, in which the influence of the electromagnetic induction is stronger and not negligible, is finite. In FIG. 6A, the extent of the effective electromagnetic field is denoted by W1. In FIG. 6B, the extent of the effective electromagnetic field is denoted by W2. According to those figures, it may be understood that the length of W2 is shorter than the length of W1, that is the extent of the effective electromagnetic field in FIG. 6B becomes relatively smaller due to the skin effect.

As regards the electromagnetic induction, in the stacked pair line composed of the signal line 14 and the ground line 15 which are adjacent to each other, the electromagnetic field crossing to those lines causes the electromagnetic induction in the signal line 14 and the ground line 15 which are adjacent to each other. That is, the energy of the electromagnetic induction is transmitted from the stacked pair line composed of the signal line 11 and the ground line 12 to the adjacent stacked pair line composed of the signal line 14 and the ground line 15. This phenomenon is referred to "crosstalk". Corresponding to the crosstalk, the wave shapes of the signals in the signal lines 11 and 14 are disturbed, namely attenuated or amplified.

Because the extent of the effective electromagnet c field becomes relatively smaller when the skin effect is caused, it may seem that the electromagnetic induction in the adjacent transmission line also becomes smaller. However, as to the high-frequency, the electromagnetic induction does not necessarily become smaller. The crosswalk due to the electromagnetic induction is fundamentally expressed by the following approximate expressions 2 and 3

$$v = L(di/dt) \approx \omega L$$  Expression 2

In the expression 2, v, L, i and ω denote the electromotive force due to the electromagnetic induction, the self-reactance of the conductor, the current and the angular velocity, respectively.

$$i=C(dv/dt)\approx \omega C \qquad \text{Expression 3}$$

In the expression 3, C denotes the electrostatic capacity between the conductors.

If the frequency is denoted as f, ω and f satisfy the following relation.

$$\omega=2\pi f$$

That is, the angular velocity ω increases in proportion to the frequency f. Therefore, according to the expressions 2 and 3, it may be understood that the electromagnetic induction increases when the frequency increases. As to the high frequency, the electromagnetic induction increases although the extent of the effective electromagnetic field becomes smaller. That is, as to the high frequency, the skin effect is caused due to the self-defense action of the conductor, which tends to possibly avoid increasing the electromagnetic induction.

As to the high frequency current, it is not preferable that the crosstalk is caused. In order to suppress the crosstalk, it is necessary to make the extent of the effective electromagnetic field smaller.

Hereinafter, with reference to the drawings, there will be described such a matter that the extent of the effective electromagnetic field can be made smaller if the grooves are provided on the facing surfaces of the conductors.

Figure 7:
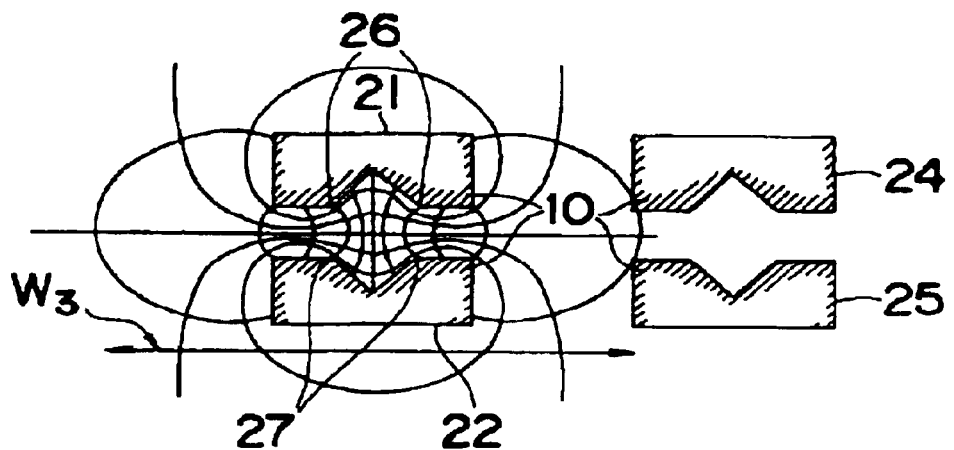
FIG. 7 is a view showing the extent of the effective electromagnetic field when grooves are formed on the facing surfaces of the conductors.

FIG. 7 shows the extent of the effective electromagnetic field when the grooves are provided on the facing surfaces of the conductors. In FIG. 7, the regions having the oblique lines 10 express portions in which the currents are concentrated, namely the electric charges are concentrated. Although the electric charges are concentrated in the facing surfaces and the corner portions of the signal line 11 and the ground line 12 in FIG. 6B, the electric charges are concentrated in the corner portions 26 and 27 on the facing surfaces of the signal line 21 and the ground line 22 in FIG. 7.

The corner portions 26 and 27 are less affected by the electromagnetic field due to the current in the adjacent conductors and tend to concentrate the current therein, as same as the corner portions and peripheral portions shown in FIG. 4C. It may be understood that the coupling of the stacked pair line increases due to the corner portions 26 and 27. As the result, the characteristic impedance of the stacked pair line whose facing surfaces have the grooves, becomes smaller than that of the simple stacked pair line. Further, because the grooves are provided on the facing surfaces of the signal line 21 and the ground line 22, the electromagnetic field does not spread out, but is converged to the central portion. Therefore, if a comparison is made among the cases of FIGS. 6A, 6B and 7, the extent of the effective electromagnetic field W3 of FIG. 7 is smaller than the extent W1 of FIG. 6A or the extent W2 of FIG. 6B. Because the extent of the effective electromagnetic field W3 is relatively smaller, the crosstalk in the signal line 24 and the ground line 25, each of which is the adjacent transmission line, becomes smaller.

According to the above-mentioned matters, in order to reduce the crosstalk in the adjacent transmission line, it is adequate to make the extent of the effective electromagnetic field smaller, namely to provide the grooves on the facing surfaces. Hereupon, it is more preferable that the grooves are disposed at positions which are far from the adjacent transmission lines, namely at the positions near the centers of the facing surfaces.

In the wiring structure for the transmission line according to Embodiment 1, because the grooves are provided on the facing surfaces of the signal line and the ground line, the crosstalk becomes smaller so that the wiring structure may become suitable for transmitting high frequency signals.

(Embodiment 2)

Hereinafter, there will be described Embodiment 2 of the present invention with reference to the accompanying drawings.

Figure 8:
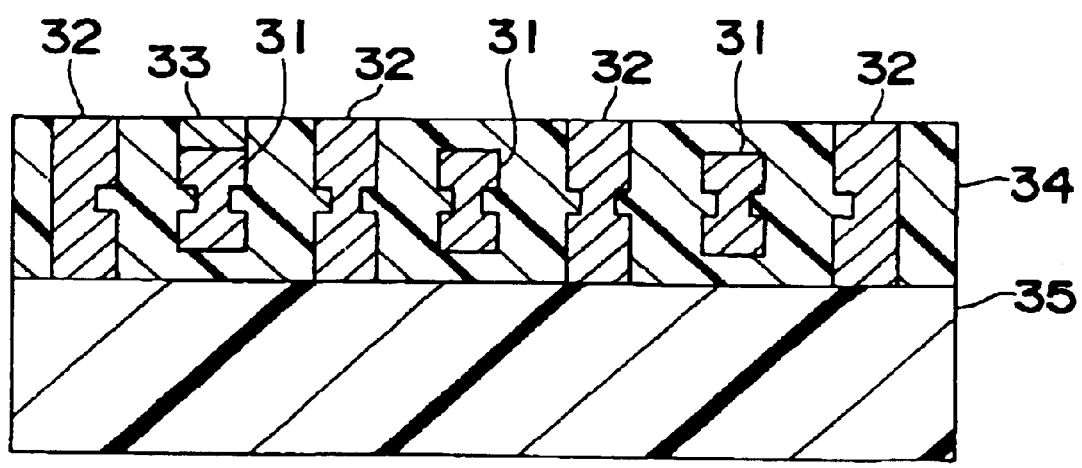
FIG. 8 is a sectional view showing a wiring structure according to the second embodiment of the present invention.

FIG. 8 is a sectional view showing a wiring structure according to Embodiment 2. As shown in FIG. 8, the wiring structure includes a substrate 35 (wiring substrate), signal lines 31, ground lines 32, a surface output portion 33 for the signal lines 33 and a dielectric 34.

In the wiring structure, the dielectric 34 is disposed on the upper surface (main surface) of the substrate 35. The signal lines 31 face the ground lines 32 in the dielectric 34. The signal lines 31 and the ground lines 32 form a pair of transmission lines. Each at the signal lines 31 and the ground lines 32 is provided with grooves extending in the transmission direction on the facing surfaces thereof. The facing surfaces are perpendicular to the upper surface of the substrate 35. Alternatively, the grooves may be provided only on the signal lines 31 or the ground lines 32. The surface output portion 33 for the signal lines 31 is used for picking up the signals in the signal lines 31 to the surface side. Because the surface output portion 33 for the signal lines 31 is exposed outward at the surface of the dielectric 34, a flip chip can be connected to the surface output portion 33. On the substrate 35, the dielectric 34 surrounds the signal lines 31, the ground lines 32 and the surface output portion 33 for the signal lines 31.

In the wiring structure, the signal lines 31 are less affected by the electromagnetic field of the other adjacent signal lines 31. The reason is that the indexes of the spatial distributions of strength of the electric field and strength of the magnetic field are the density of the field lines of electric force and the density of the field lines of magnetic force. In the stacked pair line or the micro strip line, the space, in which the density of the lines of electric force and the density of the lines of magnetic force are higher, radially extends from the lateral open portions of the pair lines.

For example, in FIG. 7, the upper portion of the signal line 21 and the lower portion of the ground line 22 are shadows for the electromagnetic field going out from the facing surfaces, where the density of the electromagnetic field is relatively lower. The upper portion of the signal line 21 and the lower portion of the ground line 22 in FIG. 7 correspond to the portions between the signal lines 31 and the ground lines 32 in FIG. 8. The portions between the signal lines 31 and the ground lines 32 in FIG. 8 are shadows for the electromagnetic field going out from the facing surfaces of the adjacent signal lines 31 and the adjacent ground lines 32, although the density of the electromagnetic field is higher at the portions, as same as the case of the portion between the signal line 21 and the ground line 22 in FIG. 7.

In FIG. 8, in order to weaken the electromagnetic field generated by the pair of the adjacent signal lines 31 and the ground lines 32, the width of each of the ground lines 32 is made wider. However, the widths of the ground lines 32 may be identical to the widths of the signal lines 31. In addition, in order to increase the electrode area on the surface of the wiring structure, the ground lines 32 may be disposed such that they are not exposed outward from the dielectric 34.

The trench structure shown in FIG. 8 can be formed using a conventional processing technique. For example, there may be used a damascene process using deposition of plating, a stack cutting process or a build up process.

Figure 9A:
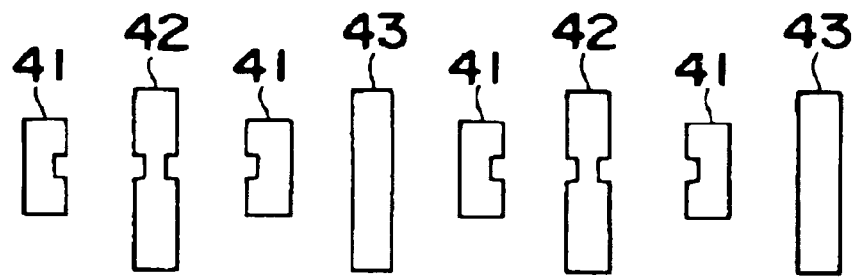
FIGS. 9A and 9B are views showing other wiring structures according to the present invention.
Figure 9B:
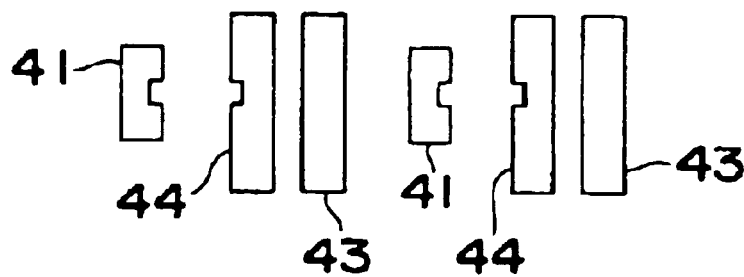

Hereinafter, there will be described another wiring structure which is different from the wiring structure shown in FIG. 8. FIGS. 9A and 9B show other wiring structures different from that shown in FIG. 8. In the wiring structure of the strip line shown in FIG. 8, a portion of the dielectric 34 and one signal line 31 are sandwiched between two adjacent ground lines 32. In other word, the signal lines 31 and the ground lines 32 are alternately disposed in the direction parallel to the upper surface of the substrate 35. On the other hand, in the wiring structure shown in FIG. 9A, the ground lines 42 and power supply lines 43 are alternately disposed one by one in each of the spaces between two adjacent signal lines. That is, they are disposed according to the following order.

(Signal line 41, ground line 42, signal line 41, power supply line 43, signal line 41, . . . )

Meanwhile, in the wiring structure shown in FIG. 9B, one ground line 44 and one power supply line 43 are disposed in each of the spaces between two adjacent signal lines 41. For example, they are disposed according to the following order.

(Signal line 41, ground line 44, power supply line 43, signal line 41, ground line 44, . . . ) Hereupon, the ground lines 44 and the power supply lines 43 may be disposed in the inverse order.

In the wiring structure shown in FIG. 9B, if the electrostatic capacity caused by the power supply lines 43 and the ground lines 44 is made larger, the wiring structure can act as a by-pass capacitor. The wiring structure is very effective for transmitting signals at high speed because it can act as a by-pass capacitor. The wiring structure shown in FIG. 8, 9A or 9B may be stacked to form a wiring structure of a multi-layer type.

Hereinafter, there will be described wiring structures of multi-layer types in each of which a plurality of the wiring structure shown in FIG. 8, 9A or 9B are stacked.

Figure 10:
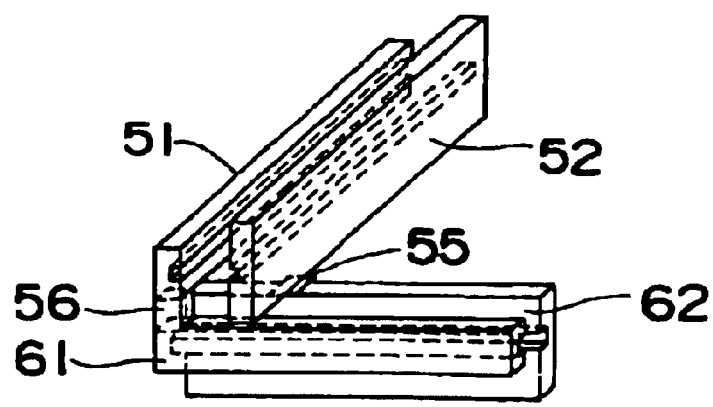
FIG. 10 is a perspective view showing a wiring structure of a multi-layer type.

FIG. 10 is a perspective view showing a wiring structure of a multi-layer type. As shown in FIG. 10, the wiring structure includes a Y-directional signal line 51, a Y-directional ground line 52, a ground line connecting pad 55, a signal line connecting column 56, an X-directional signal line 61 and an X-directional ground line 62.

In the wiring structure, the Y-directional signal line 51 laces the Y-directional ground line 52 while the X-directional signal line 61 faces the X-directional ground line 62. These lines 51, 52, 61 and 62 form a pair transmission line. Each of the Y-directional signal line 51 and the Y-directional ground line 52 is provided with a groove extending in the transmission direction on the facing surface thereof. Similarly, each of the X-directional signal line 61 and the X-directional ground line 62 is also provided with a groove extending in the transmission direction on the facing surface thereof. Alternatively, the grooves nay be provided only on the signal lines 51 and 61, or the ground lines 52 and 62. The Y-directional signal line 51 and the X-directional signal line 61 meet to each other at right angles, and are connected to each other through the signal line connecting column 56. The Y-directional ground line 52 and the X-directional ground line 62 meet to each other at right angles, and are connected to each other through the ground line connecting pad 55. The transmission direction of the Y-directional signal line 51 and the transmission direction of the X-directional signal line 61 meet to each other at the right angles.

Although it is not shown in FIG. 10, the Y-directional signal line 51 and the Y-directional ground line 52 are covered with a dielectric. The X-directional signal line 61 and the X-directional ground line 62 are also covered with a dielectric. Although it is not shown, the wiring structure is provided on a substrate (wiring substrate). Although only one set of the X-directional pair line and the Y-directional pair line is shown in FIG. 10, there may be provided a plurality of signal lines orienting in the same direction and a plurality of ground lines orienting in the same direction.

Hereupon, the Y-directional signal line 51 and the X-directional signal line 61 need not meet to each other at right angles, if only they orient to directions different from each other.

According to the wiring structure, a bi-directional transmission line can be obtained.

Figure 11:
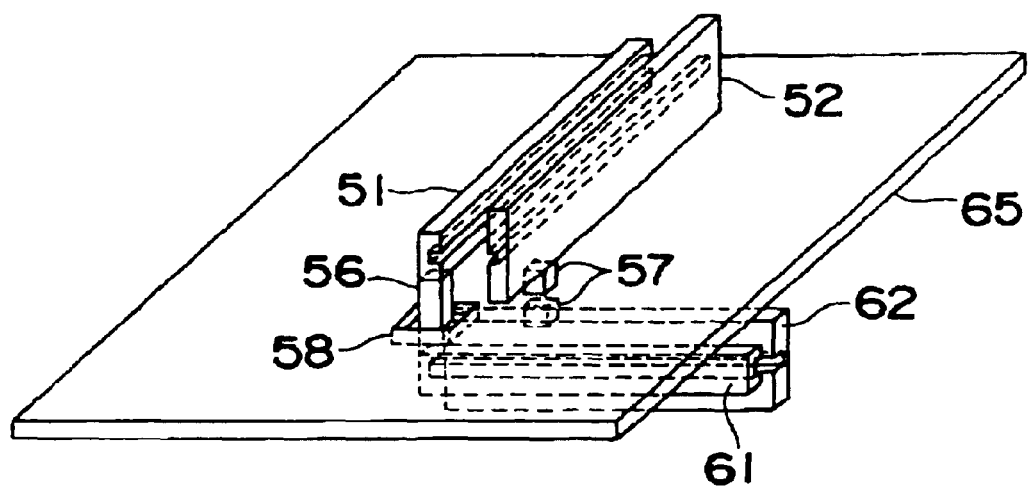
FIG. 11 is a perspective view showing another wiring structure of a multi-layer type.
Figure 12:
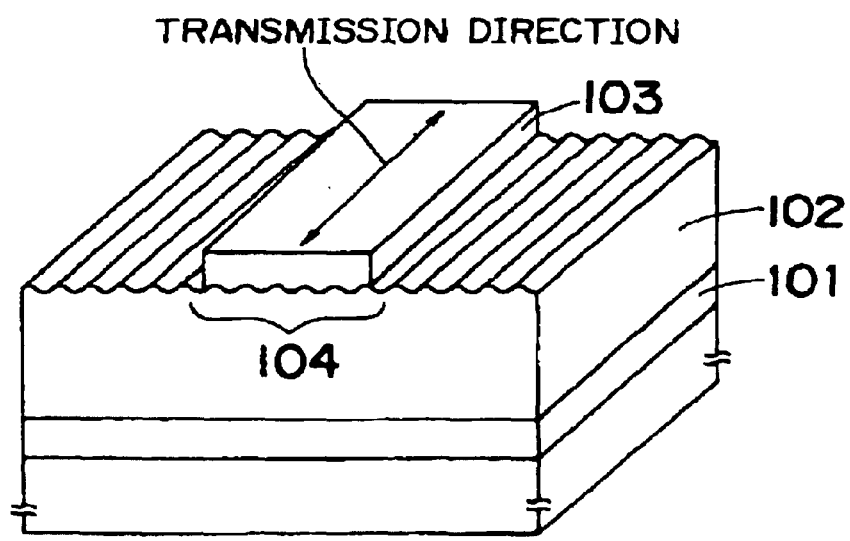
FIG. 12 is a perspective view showing a conventional wiring structure.

In FIG. 11, another wiring structure of a multi-layer type is shown. The wiring structure shown in FIG. 11 is provided with a flat ground 65 disposed between the X-directional pair signal line and the Y-directional pair signal line in addition to the wiring structure shown in FIG. 10. The wiring structure shown in FIG. 11 includes a Y-directional signal line 51, a Y-directional ground line 52, a signal line connecting column 56, ground line connecting columns 57, an X-directional signal line 61, an X-direction ground line 62 and the flat ground 65 with a hole 58.

In the wiring structure, the Y-directional signal line 51 faces the Y-directional ground line 52 while the X-directional signal line 61 faces the X-directional ground line 62. These lines 51, 52, 61 and 62 form a pair transmission line. Each of the Y-directional signal line 51 and the Y-directional ground line 52 is provided with a groove extending in the transmission direction on the facing surface thereof. Similarly, each of the X-directional signal line 61 and the X-directional ground line 62 is also provided with a groove extending in the transmission direction on the facing surface thereof. It is preferable that each of the grooves is disposed at a nearly central position of the facing surface corresponding thereto. Alternatively, the grooves may be provided only on the signal lines 51 and 61, or the ground lines 52 and 62.

The Y-directional signal line 51 and the X-directional signal line 61 meet to each other at right angles, and are connected to each other through the signal line connecting column 56 disposed through the hole 58 of the frat ground 65. The Y-directional ground line 52 and the X-directional ground line 62 meet to each other at right angles, and are connected to the flat ground 65 through the ground line connecting columns 57. The transmission direction of the Y-directional signal line 51 and the transmission direction of the X-directional signal line 61 meet to each other at right angles.

Although it is not shown in FIG. 11, the Y-directional signal line 51 and the Y-directional ground line 52 are covered with a dielectric. The X-directional signal line 61 and the X-directional ground line 62 are also covered with a dielectric. Although it is not shown, the wiring structure is provided on a substrate. Although only one set of the X-directional pair line and the Y-directional pair line is shown in FIG. 11, there may be provided a plurality of signal lines orienting in the same direction and a plurality of ground lines orienting in the same direction.

Hereupon, the Y-directional signal line 51 and the X-directional signal line 61 need not meet to each other at right angles, if only they orient to directions different from each other.

According to the wiring structure, because the flat ground 65 is provided between the Y-directional signal line 51 and the X-directional signal line 61, the crosstalk in the Y-directional signal line 51 and the X-directional signal line 61 may be suppressed.

In the wiring structures according to Embodiment 2, each of the facing surfaces is provided one groove of a rectangular shape. However, the groove may be formed in various shapes, for example, as shown in FIGS. 2A to 2D. Meanwhile, each of the facing surfaces may have a plurality of grooves. Each of the facing surfaces may have a cutout as shown in FIGS. 3A to 3C, instead of the groove. In the wiring structures according to Embodiment 2, each of the power supply lines 43 is connected to a power source, while each of the signal lines 31, 41, 51 and 61 is connected to a signal source. Further, each of the ground lines 32, 42, 44, 52 and 62 is connected to the ground.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A wiring structure for a transmission line comprising:

a wiring substrate;

a dielectric provided on a main surface of said wiring substrate;

a ground line disposed in said dielectric; and a signal line disposed so as to face said ground line, which is disposed in said dielectric, wherein at least one of a surface of said signal line facing said ground line and a surface of said ground line facing said signal line is provided with a groove extending in a transmission direction, said surface of said signal line and said surface of said ground line being perpendicular to said main surface of said wiring substrate.

2. The wiring structure according to claim 1, wherein each of said grooves is located at a nearly center position of said surface corresponding thereto.

\* \* \* \* \*